United States Patent
Wada et al.

(10) Patent No.: US 9,583,682 B2
(45) Date of Patent: Feb. 28, 2017

(54) LIGHT-EMITTING DEVICE AND METHOD OF MANUFACTURING THE SAME

(71) Applicant: TOYODA GOSEI CO., LTD., Kiyosu-shi (JP)

(72) Inventors: Satoshi Wada, Kiyosu (JP); Masakata Koseki, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/597,002

(22) Filed: Jan. 14, 2015

(65) Prior Publication Data
US 2015/0207045 A1    Jul. 23, 2015

(30) Foreign Application Priority Data
Jan. 21, 2014    (JP) .................. 2014-008810

(51) Int. Cl.
*H01L 33/00* (2010.01)
*H01L 33/50* (2010.01)
*H01L 33/56* (2010.01)
*H01L 33/52* (2010.01)
(Continued)

(52) U.S. Cl.
CPC ........ *H01L 33/505* (2013.01); *H01L 25/0753* (2013.01); *H01L 33/52* (2013.01); *H01L 33/56* (2013.01); *H01L 33/60* (2013.01); *H01L 2924/0002* (2013.01); *H01L 2933/0041* (2013.01); *H01L 2933/0058* (2013.01)

(58) Field of Classification Search
CPC ....... H01L 33/505; H01L 33/52; H01L 33/60; H01L 33/56; H01L 2933/0041; H01L 2933/0058; H01L 25/0753
See application file for complete search history.

(56) References Cited

U.S. PATENT DOCUMENTS

| 2010/0320479 | A1  | 12/2010 | Minato et al. |
| 2011/0254039 | A1* | 10/2011 | Kim ................ H01L 33/46 257/98 |
| 2011/0309388 | A1  | 12/2011 | Ito et al. |

(Continued)

FOREIGN PATENT DOCUMENTS

| JP | 2003-101074 A | 4/2003 |
| JP | 2005-072129 A | 3/2005 |

(Continued)

OTHER PUBLICATIONS

Japanese Office Action dated Dec. 6, 2016, with partial English Translation thereof.

*Primary Examiner* — Su C Kim
(74) *Attorney, Agent, or Firm* — McGinn IP Law Group, PLLC.

(57) ABSTRACT

A light-emitting device includes a plurality of light-emitting elements face-down mounted on a substrate, a phosphor-containing film on the plurality of light-emitting elements directly or via a transparent adhesive layer, a transparent plate provided on the phosphor-containing film so as to directly contact the film, and a white reflector to cover a side surface of the plurality of light-emitting elements and, of side surfaces of the phosphor-containing film, at least a side surface not located above a gap between the plurality of light-emitting elements. At least a portion of a region directly above the gap is not covered with the phosphor-containing film.

20 Claims, 8 Drawing Sheets

(51) Int. Cl.
*H01L 25/075* (2006.01)
*H01L 33/60* (2010.01)

(56) References Cited

U.S. PATENT DOCUMENTS

| | | | |
|---|---|---|---|
| 2012/0140506 A1* | 6/2012 | Waragawa | H01L 25/0753 362/516 |
| 2012/0235169 A1* | 9/2012 | Seko | H01L 33/60 257/88 |
| 2012/0236582 A1 | 9/2012 | Waragaya et al. | |
| 2013/0001605 A1 | 1/2013 | Ishihara et al. | |

FOREIGN PATENT DOCUMENTS

| | | |
|---|---|---|
| JP | 2007-019096 A | 1/2007 |
| JP | 2011-134829 A | 7/2011 |
| JP | 2011-228703 A | 11/2011 |
| JP | 2012-004303 A | 1/2012 |
| JP | 2013-016588 A | 1/2013 |
| JP | 2013-077679 A | 4/2013 |
| WO | WO 2009/069671 A1 | 6/2009 |

\* cited by examiner

LIGHT-EMITTING DEVICE AND METHOD OF MANUFACTURING THE SAME

The present application is based on Japanese patent application No. 2014-008810 filed on Jan. 21, 2014, the entire contents of which are incorporated herein by reference.

BACKGROUND OF THE INVENTION

1. Field of the Invention

The invention relates to a light-emitting device and a method of manufacturing the light-emitting device.

2. Description of the Related Art

A light-emitting device is known which has a phosphor layer with a phosphor included therein and in which the side surface of a light-emitting element is covered with a light-reflecting member (see, e.g., JP-A-2007-19096, WO 2009/069671 and JP-A-2011-134829). In the light-emitting device, light laterally emitted from the light-emitting element is reflected by the light-reflecting member so as to improve luminance.

JP-A-2007-19096 discloses a light-emitting device in which a flip-chip mounted LED element, except a light-extracting surface, is covered with a coating material including light-reflecting particles and a phosphor layer in the form of sheet is provided on the light-extracting surface of the LED element.

WO 2009/069671 and JP-A-2011-134829 disclose a light-emitting device in which a plate-shaped light transmissive member including a phosphor is provided on plural flip-chip mounted light-emitting elements and the side surface of the light-emitting elements and the light transmissive member is covered with a covering member including a light reflecting material.

SUMMARY OF THE INVENTION

The light-emitting devices disclosed in JP-A-2007-19096, WO 2009/069671 and JP-A-2011-134829 are constructed such that a region around the light-emitting element and directly above the light-reflecting member is covered with a layer including the phosphor. Since the amount of light directly inputted from the light-emitting elements is low in a region of the layer including the phosphor directly above the light-reflecting member, light emitted from the region has a large proportion of fluorescence and chromaticity is different from that in light emitted from other regions. Thus, a problem may arise that the difference in emission chromaticity between different regions is visually recognized as color unevenness.

It is an object of the invention to provide a light-emitting device that offers a high brightness and a high color evenness even when provided with the phosphor layer, as well as a method of manufacturing the light-emitting device.

(1) According to one embodiment of the invention, a light-emitting device comprises:

a plurality of light-emitting elements face-down mounted on a substrate;

a phosphor-containing film on the plurality of light-emitting elements directly or via a transparent adhesive layer;

a transparent plate provided on the phosphor-containing film so as to directly contact the film; and a white reflector to cover a side surface of the plurality of light-emitting elements and, of side surfaces of the phosphor-containing film, at least a side surface not located above a gap between the plurality of light-emitting elements, wherein at least a portion of a region directly above the gap is not covered with the phosphor-containing film.

(2) According to another embodiment of the invention, a light-emitting device comprises:

a plurality of light-emitting elements face-down mounted on a substrate;

a single phosphor-containing film provided on the plurality of light-emitting elements directly or via a transparent adhesive layer;

a transparent plate provided on the phosphor-containing film so as to directly contact the film;

a white reflector to cover, of side surfaces of the plurality of light-emitting elements, a side surface not facing a gap therebetween and, of side surfaces of the phosphor-containing film, a side surface not located above the gap; and a transparent material provided in the gap between the plurality of light-emitting elements.

In the above embodiment (1) or (2) of the invention, the following modifications and changes can be made.

(i) The phosphor-containing film comprises a plurality of phosphor-containing films that are each provided on each of the plurality of light-emitting elements.

(ii) The transparent plate comprises a single transparent plate provided on the plurality of phosphor-containing films.

(iii) The transparent plate comprises a plurality of transparent plates that are each provided one each of the plurality of phosphor-containing films.

(3) According to another embodiment of the invention, a method of manufacturing a light-emitting device comprises:

adhering a phosphor-containing film formed on a transparent plate to a plurality of light-emitting elements face-down mounted on a substrate such that the phosphor-containing film contacts the plurality of light-emitting elements directly or via a transparent adhesive layer; and covering with a white reflector a side surface of the plurality of light-emitting elements and, of side surfaces of the phosphor-containing film, at least a side surface not located above a gap between the plurality of light-emitting elements, wherein at least a portion of a region immediately above the gap is not covered with the phosphor-containing film.

(4) According to another embodiment of the invention, a method of manufacturing a light-emitting device comprises:

adhering a single phosphor-containing film formed on a single transparent plate to a plurality of light-emitting elements face-down mounted on a substrate such that the phosphor-containing film contacts the plurality of light-emitting elements directly or via a transparent adhesive layer;

filling a gap between the plurality of light-emitting elements with a transparent material; and covering with a white reflector, of side surfaces of the plurality of light-emitting elements, a side surface not facing the gap therebetween and, of side surfaces of the phosphor-containing films, a side surface not located above the gap.

In the above embodiment (3) or (4) of the invention, the following modifications and changes can be made.

(iv) The phosphor-containing film comprises a plurality of phosphor-containing films that are each provided on each of the plurality of light-emitting elements.

(v) The transparent plate comprises a single transparent plate with the plurality of phosphor-containing films formed on a surface thereof.

(vi) The transparent plate comprises a plurality of transparent plates each having each of the plurality of phosphor-containing films formed on a surface thereof.

Effects of the Invention

According to one embodiment of the invention, a light-emitting device can be provided that offers a high brightness and a high color evenness even when provided with the phosphor layer, as well as a method of manufacturing the light-emitting device.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Figure 1:
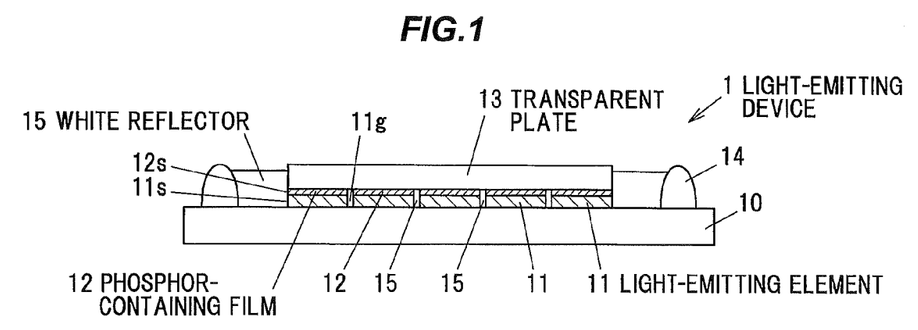
FIG. 1 is a vertical cross-sectional view showing a light-emitting device in a first embodiment.
Figure 2A:
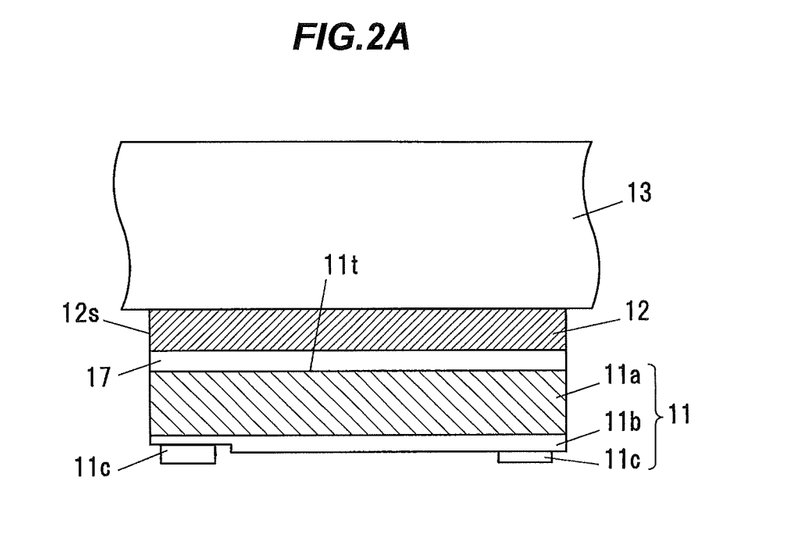
FIGS. 2A and 2B are vertical cross-sectional views showing the periphery of one of light-emitting elements of the light-emitting device in the first embodiment.
Figure 2B:
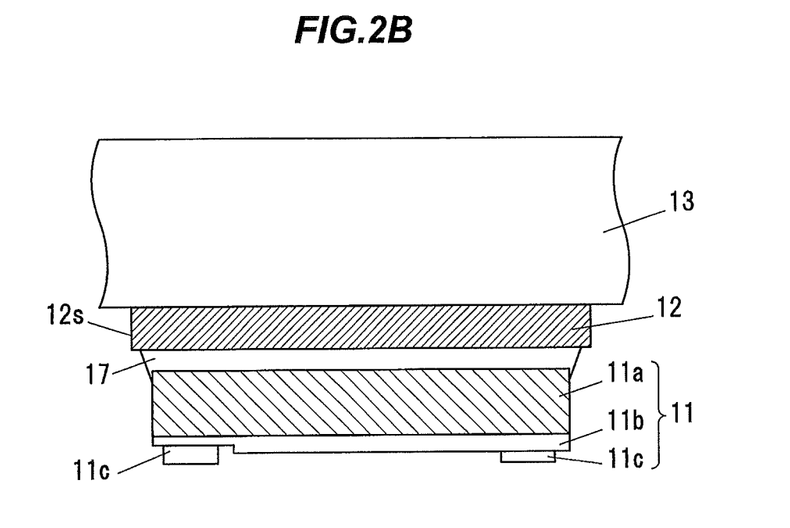

FIG. 1 is a vertical cross-sectional view showing a light-emitting device 1 in the first embodiment. FIGS. 2A and 2B are vertical cross-sectional views showing the periphery of one of light-emitting elements 11 of the light-emitting device 1.

The light-emitting device 1 has plural light-emitting elements 11 face-down mounted on a substrate 10, phosphor-containing films 12 provided on the plural light-emitting elements 11 via transparent adhesive layers 17, a transparent plate 13 provided on the phosphor-containing films 12 so as to be directly in contact therewith, and a white reflector 15 covering side surface of the plural light-emitting elements 11 and also covering, among all side surfaces of the phosphor-containing films 12, at least side surfaces 12s which are not located above gaps 11g between the plural light-emitting elements 11. In the light-emitting device 1, at least a portion of a region immediately above the gap 11g is not covered with the phosphor-containing film 12.

FIG. 2A is a diagram illustrating the periphery of the light-emitting element 11 when the area of the phosphor-containing film 12 is substantially equal to that of the light-emitting element 11. In this case, the white reflector 15 is virtually absent in the region immediately above the gap 11g.

FIG. 2B is a diagram illustrating the periphery of the light-emitting element 11 when the area of the phosphor-containing film 12 is larger than that of the light-emitting element 11 (the adjacent phosphor-containing films 12 are not in contact with each other). In this case, the white reflector 15 is present in some portion of the region immediately above the gap 11g but does not entirely cover the region immediately above the gap 11g.

In the light-emitting device 1, plural phosphor-containing films 12 are provided, one each, on the plural light-emitting elements 11, and the single transparent plate 13 is provided on the plural phosphor-containing films 12. In addition, the white reflector 15 is provided also in a portion of the gaps 11g between the plural light-emitting elements 11 so as to at least partially cover side surfaces of the plural light-emitting elements 11 facing the gaps 11g.

Since the white reflector 15 is formed to cover the side surfaces of the light-emitting elements 11 and the side surfaces 12s of the phosphor-containing films 12, light laterally emitted from the light-emitting elements 11 and the phosphor-containing films 12 is reflected by the white reflector 15 and this improves light extraction efficiency of the light-emitting device 1. In order to further improve the light extraction efficiency of the light-emitting device 1, it is preferable that the white reflector 15 fill the entire gaps 11g and also cover the side surfaces of the phosphor-containing films 12 above the gaps 11g.

The substrate 10 is formed of, e.g., MN. The substrate 10 is a substrate having wirings (not shown) and is, e.g., a wiring substrate having a wiring pattern on a surface or a lead frame inserted board.

The light-emitting element 11 is an LED chip having a chip substrate 11a and a crystal layer 11b which has cladding layers and a light-emitting layer sandwiched therebetween, as shown in FIGS. 2A and 2B. Alternatively, a light-emitting element other than the LED chip, such as laser diode may be used. The chip substrate 11a is, e.g., a sapphire substrate or a GaN substrate.

The light-emitting element 11 is face-down mounted, e.g., flip-chip mounted. Therefore, the crystal layer 11b is located on the lower side and the chip substrate 11a is located on the upper side. Thus, the phosphor-containing film 12 is in contact with the chip substrate 11a of the light-emitting element 11. Electrodes 11c are respectively connected to n-type and p-type layers of the crystal layer 11b and the light-emitting element 11 is connected to a wiring portion of the substrate 10 via the electrodes 11c.

The phosphor-containing film 12 is formed of, e.g., ceramics such as alumina containing phosphor particles, glass containing phosphor particles or resin containing phosphor particles. Since ceramics have better heat resistance and light resistance than resin, ceramics containing phosphor particles are particularly preferable as a material of the phosphor-containing film 12. For forming the phosphor-containing film 12 using ceramics containing phosphor particles, for example, an ink containing a mixture of YAG phosphor particles and alumina powder is applied and sintered on a surface of the transparent plate 13.

The thickness of the phosphor-containing film 12 is preferably not more than 50 µm. When the thickness of the phosphor-containing film 12 is increased, the phosphor particle concentration is reduced to maintain emission chromaticity. However, if the phosphor-containing film 12 is thicker than 50 µm, the reduced phosphor particle concentration causes a decrease in thermal conductivity and this adversely affects emission characteristics. In addition, the reduced phosphor particle concentration also causes uneven distribution of phosphor particles and unevenness in emission color is more likely to occur.

In addition, the grain size of phosphor particles is preferably small in order to reduce the uneven distribution of phosphor particles. The grain size of phosphor particles is preferably, e.g., not more than 15 µm, more preferably, not more than 5 µm.

The phosphor particles contained in the phosphor-containing film 12 absorb energy of light emitted from the light-emitting element 11 and emit fluorescence. A color of light emitted from the light-emitting element 11 and exiting to the outside through the phosphor-containing film 12 is mixed with a color of fluorescence emitted from the phosphor particles and the resulting mixed color is the emission color of the light-emitting device 1. When, for example, the emission color of the light-emitting element 11 is blue and the fluorescent color of the phosphor particles contained in the phosphor-containing film 12 is yellow, the emission color of the light-emitting device 1 is white.

The phosphor-containing film 12 is adhered onto the light-emitting element 11 via the transparent adhesive layer 17. The transparent adhesive layer 17 is formed of, e.g., a transparent resin adhesive, a transparent inorganic adhesive or low-melting-point glass. The illustration of the transparent adhesive layer 17 is omitted in FIG. 1.

The transparent plate 13 is formed of a transparent material such as glass, sapphire or resin. By using a material with low thermal conductivity (W/(m·K)) for the transparent plate 13, deterioration of the white reflector 15 caused by the elevated temperature of the transparent plate 13 is suppressed and reliability of the light-emitting device 1 is thus improved.

In addition, it is possible to further reduce unevenness in emission color of the light-emitting device 1 by roughening the surface of the transparent plate 13, adding a light-scattering material or providing a covering layer containing a scattering material. As the light-scattering material, it is possible to use a material having a different refractive index from that of the transparent plate 13, e.g., titanium oxide.

A dam 14 is formed of, e.g., resin, metal, ceramics or glass, etc. In the light-emitting device 1, the dam 14 does not need to have light reflectivity since the white reflector 15 is provided.

The white reflector 15 is formed of, e.g., resin such as silicone resin or epoxy resin, or low-melting-point glass, containing white pigment such as titanium oxide.

Figure 3:
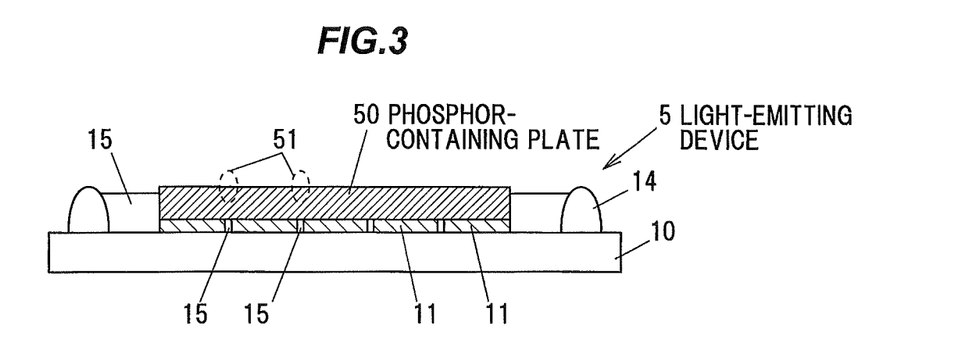
FIG. 3 is a vertical cross-sectional view showing a light-emitting device in Comparative Example.

FIG. 3 is a vertical cross-sectional view showing a light-emitting device 5 in Comparative Example. The light-emitting device 5 has a plate-shaped phosphor-containing plate 50 in place of the phosphor-containing film 12 and the transparent plate 13 of the light-emitting device 1. The phosphor-containing plate 50 is formed of, e.g., transparent resin or glass containing phosphor particles, or a single crystal phosphor, etc.

In the light-emitting device 5, the region immediately above the gaps between the plural light-emitting elements 11 is entirely covered with the phosphor-containing plate 50. Since the amount of light directly inputted from the light-emitting elements 11 is low in regions 51 of the phosphor-containing plate 50 directly above the white reflector 15, light emitted from the regions 51 has a large proportion of fluorescence and chromaticity is different from that of light emitted from other regions. In detail, when, for example, the emission color of the light-emitting elements 11 is blue and the fluorescent color of the phosphor-containing plate 50 is yellow, yellow color in light emitted from the region 51 is stronger than in light emitted from other regions. Thus, there is a possibility that such a difference in emission chromaticity between different regions is visually recognized as color unevenness in the light-emitting device 5.

In the light-emitting device 1, on the other hand, unevenness in emission color is suppressed since at least a portion of the region immediately above the white reflector 15 provided in the gaps 11g between the plural light-emitting elements 11 is not covered with the phosphor-containing film 12. In addition, since the phosphor-containing film 12 is thinner than the phosphor-containing plate 50 and is in contact with the white reflector 15 only in a small area, thermal expansion of the white reflector 15 due to heat generated by phosphor is small and damages such as cracks, etc., on the white reflector 15 due to heat deterioration can be also suppressed. Meanwhile, in the transparent plate 13, phosphor as a heat source is not contained and heat is thus not generated during operation of the light-emitting device 1. Also, temperature of the transparent plate 13 is not elevated by heat generated in the phosphor-containing film 12 since a low thermal conductivity material is used as a material of the transparent plate 13. Therefore, deterioration of the white reflector 15 when formed of resin is suppressed.

In addition, the phosphor-containing film 12 of the light-emitting device 1 is significantly thinner than the phosphor-containing plate 50 of the light-emitting device 5. Therefore, even when the base material of the phosphor-containing film 12 is a resin, etc., with low thermal conductivity, a heat propagation distance in the base material is short and thermal resistance is thus small. The heat generated by the phosphor particles is then efficiently dissipated through the light-emitting element 11. Thus, it is possible to suppress heat deterioration of the peripheral members such as the white reflector 15. In addition, the low thermal resistance of the phosphor-containing film 12 allows heat from the phosphor particles to be efficiently reduced, which improves luminous efficacy and luminous flux of the light-emitting device 1. In the phosphor-containing plate 50 which is thick and thus has high thermal resistance, temperature is elevated at a portion distant from the light-emitting element 11 which serves as a heat-dissipation portion and the peripheral members is thereby likely to be deteriorated.

Process of Manufacturing the Light-Emitting Device

An example of a manufacturing process of the light-emitting device 1 will be described below.

FIGS. 4A to 4E are vertical cross-sectional views showing the manufacturing process of the light-emitting device 1 in the first embodiment.

Figure 4A:
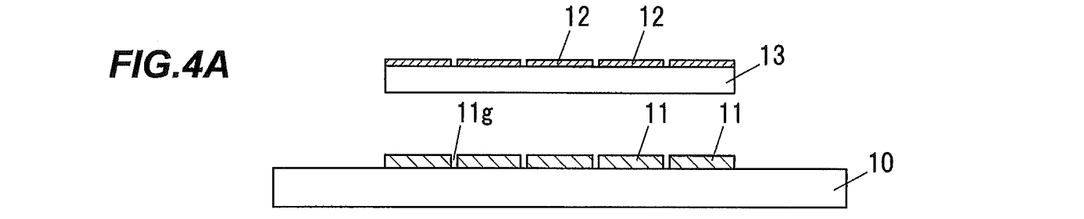
FIGS. 4A to 4E are vertical cross-sectional views showing a manufacturing process of the light-emitting device in the first embodiment.

Firstly, the plural light-emitting elements 11 are face-down mounted on the substrate 10, as shown in FIG. 4A. Meanwhile, the plural phosphor-containing films 12 are formed on a surface of the single transparent plate 13.

The light-emitting elements 11 are mounted on the substrate 10 by, e.g., bonding using solder bumps or Au stud bumps, metal particle bonding or metal surface activation, etc.

A liquid precursor, such as an ink containing a mixture of YAG phosphor particles and alumina powder, is applied to a surface of the transparent plate 13 by printing such as screen printing, spin coating or electrostatic coating and is then sintered, thereby forming the plural phosphor-containing films 12. When using spin coating or electrostatic coating, for example, the phosphor-containing film 12 is applied and sintered on the entire surface of the transparent plate 13 and is then patterned using photolithography. Alternatively, the phosphor-containing films 12 may be formed by lift-off process using a photoresist.

Figure 4B:
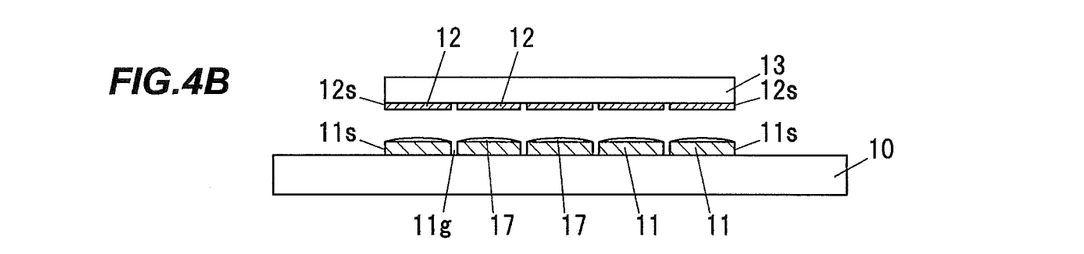
Figure 4C:
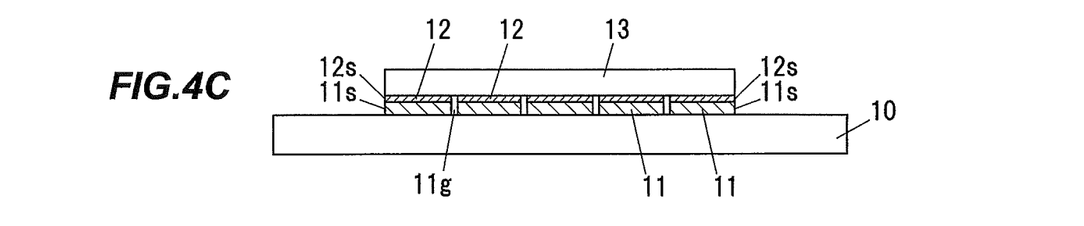

Next, as shown in FIGS. 4B and 4C, the plural phosphor-containing films 12 on the transparent plate 13 are adhered to the plural light-emitting elements 11 on the substrate 10. At first, the transparent adhesive layer 17 is applied onto each light-emitting element 11. Then, the phosphor-containing films 12 are brought into contact with the light-emitting elements 11 and are adhered thereto by the transparent adhesive layers 17. In case that low-melting-point glass is used as a base material of the phosphor-containing film 12, the phosphor-containing films 12 can serve as an adhesive layer and thus may be directly adhered to the light-emitting elements 11 by heating. The transparent adhesive layer 17 is not used in this case.

At this time, the light-emitting elements 11 and the phosphor-containing films 12 are adhered so that at least a portion of the region immediately above the gaps 11g between the plural light-emitting elements 11 is not covered with the phosphor-containing films 12.

Figure 4D:
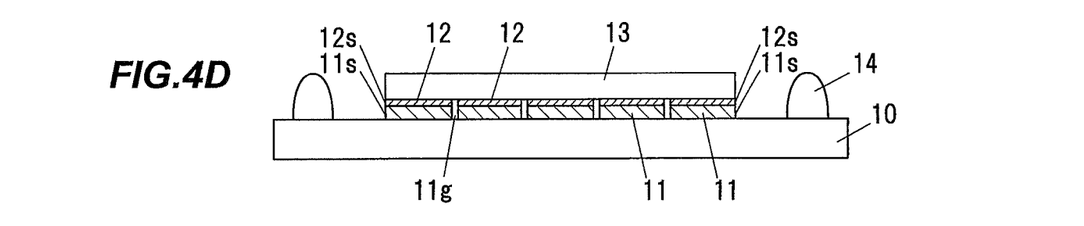

Next, as shown in MAD, the dam 14 surrounding the plural light-emitting elements 11 is formed on the substrate 10. The dam 14 is formed by, e.g., dripping a liquid white resin in an annular shape on the substrate 10 and then curing the resin.

Figure 4E:
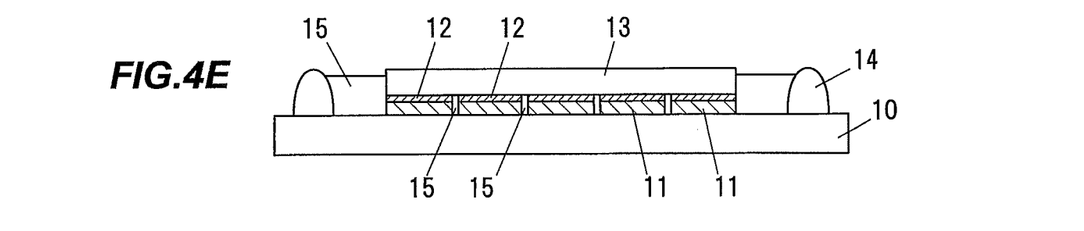

Next, as shown in FIG. 4E, the white reflector 15 is provided to fill the inside of the dam 14. The white reflector 15 is formed by, e.g., dripping a liquid white resin to fill the inside of the dam 14 and then curing the resin.

The white reflector 15 is formed so as to cover the side surfaces of the plural light-emitting elements 11 as well as, among all side surfaces of the phosphor-containing films 12, at least the side surfaces 12s not located above the gaps 11g and to fill at least a portion of the gaps 11g between the plural light-emitting elements 11. An upper surface of the transparent plate 13, which is a light-extracting surface, is not covered with the white reflector 15. The white reflector 15 filled in the gaps between the plural light-emitting elements 11 may be provided before adhering the phosphor-containing films 12 to the light-emitting elements 11.

Figure 5:
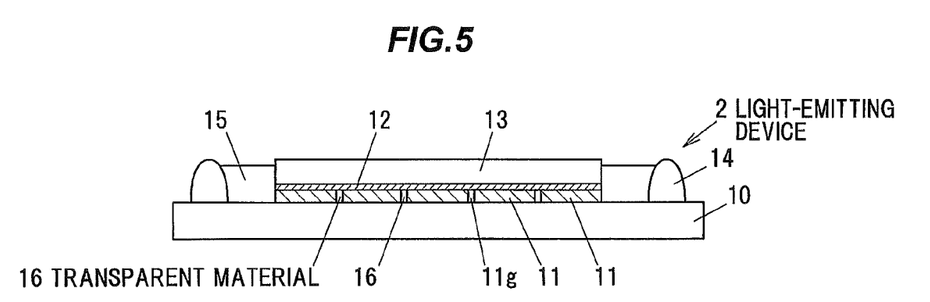
FIG. 5 is a vertical cross-sectional view showing a modification of the light-emitting device in the first embodiment.

FIG. 5 is a vertical cross-sectional view showing a light-emitting device 2 which is a modification of the light-emitting device 1 in the first embodiment. The light-emitting device 2 is different from the light-emitting device 1 in that a single phosphor-containing film 12 is provided on the plural light-emitting elements 11.

In the light-emitting device 2, preferably, a transparent material 16 such as a transparent resin is provided in the gaps 11g between the plural light-emitting elements 11 and the white reflector 15 covers only side surfaces 11s not facing the gaps 11g, among all side surfaces of the light-emitting elements 11, as shown in FIG. 5. This is because, if the white reflector 15 is provided in the gaps 11g between the plural light-emitting elements 11 in the light-emitting device 2, the region immediately above the white reflector 15 provided in the gaps 11g is entirely covered with the phosphor-containing film 12 and this may cause unevenness in emission color for the same reason as that for the light-emitting device 5. However, even in the case that the white reflector 15 is provided in the gaps 11g between the plural light-emitting elements 11, color unevenness of the light-emitting device 2 is smaller than the light-emitting device 5 since the phosphor-containing film 12 is thinner than the phosphor-containing plate 50 of the light-emitting device 5.

When the transparent material 16 is provided in the gaps 11g between the plural light-emitting elements 11, it is preferable to fill the gaps 11g between the plural light-emitting elements 11 with the transparent material 16 before adhering the phosphor-containing film 12 to the light-emitting elements 11. Alternatively, the transparent material 16 enough to fill the gaps 11g may be applied to the upper surfaces of the plural light-emitting elements 11 before adhering the phosphor-containing film 12 to the light-emitting elements 11, so the applied transparent material flows into the gaps 11g at the time of adhering the phosphor-containing film 12 to the light-emitting elements 11.

Second Embodiment

The second embodiment is different from the first embodiment in the configuration of the transparent plate of the light-emitting device. The explanation of the same features as the first embodiment will be omitted or simplified.

Configuration of Light-Emitting Device

Figure 6:
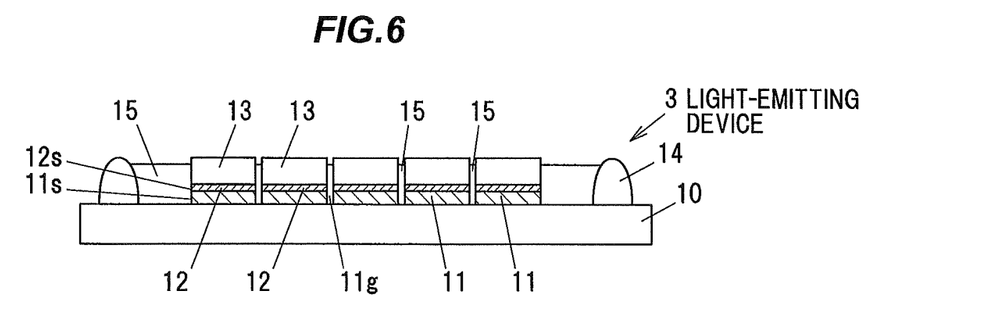
FIG. 6 is a vertical cross-sectional view showing a light-emitting device in a second embodiment.

FIG. 6 is a vertical cross-sectional view showing a light-emitting device 3 in the second embodiment. In the light-emitting device 3, plural transparent plates 13, one on each of the plural phosphor-containing films 12, are provided in place of the single transparent plate 13 of the light-emitting device 1 in the first embodiment.

In the light-emitting device 3, the transparent plates 13 are provided, one each, on the plural phosphor-containing films 12. Therefore, even when the plural light-emitting elements 11 mounted on the substrate 10 are uneven in height, a distance between the light-emitting element 11 and the phosphor-containing film 12 (thickness of the transparent adhesive layer 17) can be highly uniform and it is possible to suppress variation in emission color of each light-emitting element 11 resulting from variation in thickness of the transparent adhesive layer 17. In addition, variation in heat dissipation of each region resulting from variation in thickness of the transparent adhesive layer 17 is also reduced and this allows unevenness in emission color due to variation in temperature to be suppressed.

In addition, horizontal light propagation in the plural divided transparent plates 13 is less than in a single plate and this allows light extraction efficiency to be improved.

The white reflector 15 covers the side surfaces of the plural light-emitting elements 11 and also covers, among all side surfaces of the phosphor-containing films 12, at least the side surfaces 12s not located above the gaps 11g in the same manner as the light-emitting device 1 in the first embodiment. In order to further improve light extraction efficiency of the light-emitting device 3, it is preferable that all gaps 11g be filled and the side surfaces of the phosphor-containing films 12 above the gaps 11g be also covered.

Figure 7:
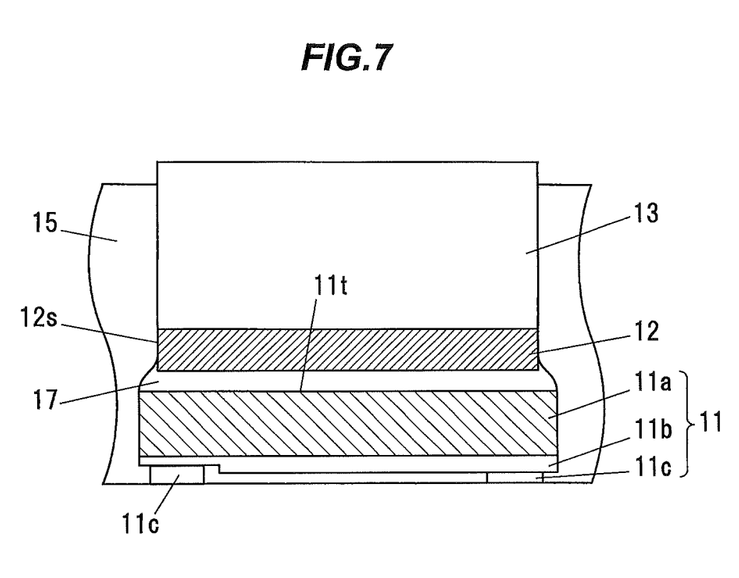
FIG. 7 is a vertical cross-sectional view showing the periphery of a light-emitting element in the second embodiment when the area of a phosphor-containing film is smaller than the area of the light-emitting element.

FIG. 7 is a vertical cross-sectional view showing the periphery of the light-emitting element 11 in the second embodiment when the area of the phosphor-containing film 12 is smaller than the area of the light-emitting element 11. In this case, the white reflector 15 is not present in the region immediately above the gaps 11g.

Process of Manufacturing the Light-Emitting Device

An example of a manufacturing process of the light-emitting device 3 will be described below.

FIGS. 8A to 8E are vertical cross-sectional views showing the manufacturing process of the light-emitting device 3 in the second embodiment.

Figure 8A:
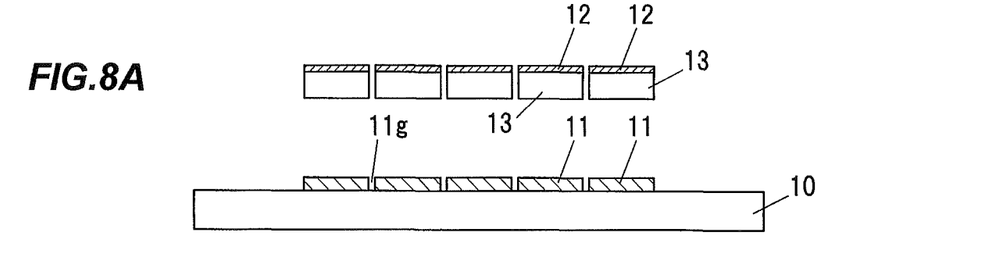
FIGS. 8A to 8E are vertical cross-sectional views showing a manufacturing process of the light-emitting device in the second embodiment.

Firstly, the plural light-emitting elements 11 are face-down mounted on the substrate 10, as shown in FIG. 8A. Meanwhile, the plural transparent plates 13 each having one of the plural phosphor-containing films 12 on the surface thereof are formed. In other words, plural blocks each composed of the transparent plate 13 and the phosphor-containing film 12 are formed.

The plural blocks composed of the transparent plate 13 and the phosphor-containing film 12 are formed by, e.g., forming the phosphor-containing film 12 on the entire surface of the transparent plate 13 and then dividing the transparent plate 13 together with the phosphor-containing film 12.

Figure 8B:
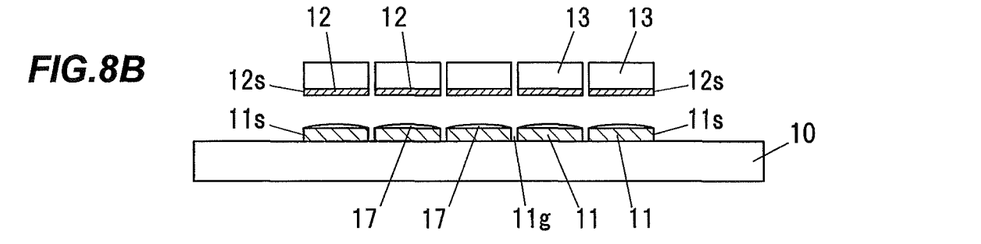
Figure 8C:
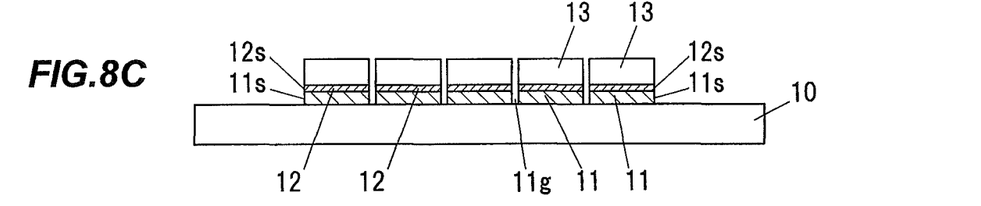

Next, as shown in FIGS. 8B and 8C, the plural phosphor-containing films 12 on the transparent plates 13 are adhered to the plural light-emitting elements 11 on the substrate 10. At first, the transparent adhesive layer 17 is applied onto each light-emitting element 11. Then, the phosphor-containing films 12 are brought into contact with the light-emitting elements 11 and are adhered thereto by the transparent adhesive layers 17. In case that low-melting-point glass is used as a base material of the phosphor-containing film 12, the phosphor-containing films 12 can serve as an adhesive layer and thus may be directly adhered to the light-emitting elements 11 by heating.

At this time, the light-emitting elements 11 and the phosphor-containing films 12 are adhered so that at least a portion of the region immediately above the gaps 11g between the plural light-emitting elements 11 is not covered with the phosphor-containing films 12.

Figure 8D:
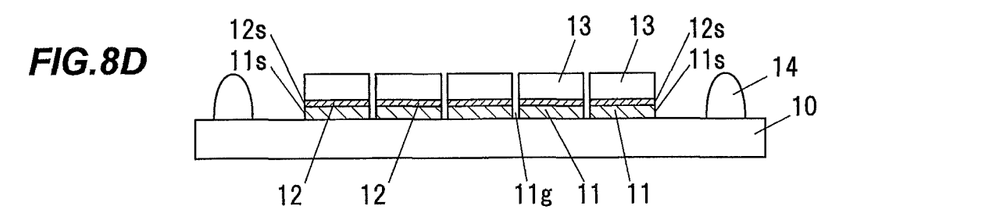

Next, as shown in FIG. 8D, the dam 14 surrounding the plural light-emitting elements 11 is formed on the substrate 10.

Figure 8E:
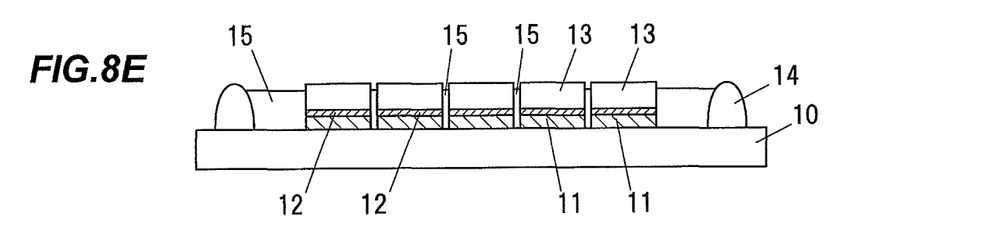

Next, as shown in FIG. 8E, the white reflector 15 is provided to fill the inside of the dam 14.

The white reflector 15 is formed so as to cover the side surfaces of the plural light-emitting elements 11 as well as, among all side surfaces of the phosphor-containing films 12, at least the side surfaces 12s not located above the gaps 11g and to fill at least a portion of the gaps 11g between the plural light-emitting elements 11. Upper surfaces of the transparent plates 13, which are light-extracting surfaces, are not covered with the white reflector 15.

Effects of the Embodiments

In the first and second embodiments, the phosphor-containing film(s) formed on the transparent plate is used as a phosphor layer and the white reflector is provided to surround the light-emitting elements as well as the phosphor layer, thereby allowing a high-intensity light-emitting device with less color unevenness to be obtained.

Although the embodiments of the invention have been described, the invention is not intended to be limited to the embodiments and the various kinds of modifications can be implemented without departing from the gist of the invention.

In addition, the invention according to claims is not to be limited to the embodiments. Further, all combinations of the features described in the embodiments are not necessary to solve the problem of the invention.

What is claimed is:

1. A light-emitting device, comprising:
    a plurality of light-emitting elements face-down mounted on a substrate;
    a phosphor-containing film on the plurality of light-emitting elements directly or via a transparent adhesive layer;
    a transparent plate provided on the phosphor-containing film so as to directly contact the film; and
    a white reflector to cover a side surface of the plurality of light-emitting elements and, of side surfaces of the phosphor-containing film, at least a side surface not located above a gap between the plurality of light-emitting elements,
    wherein a region directly above the gap is not covered with the phosphor-containing film, and
    wherein a part of the gap is filled with the white reflector and an empty space is formed on the part of the gap.

2. The light-emitting device according to claim 1, wherein the phosphor-containing film comprises a plurality of phosphor-containing films that are each provided on each of the plurality of light-emitting elements.

3. The light-emitting device according to claim 2, wherein the transparent plate comprises a single transparent plate provided on the plurality of phosphor-containing films.

4. The light-emitting device according to claim 2, wherein the transparent plate comprises a plurality of transparent plates that are each provided one each of the plurality of phosphor-containing films.

5. A light-emitting device, comprising:
    a plurality of light-emitting elements face-down mounted on a substrate;
    a single phosphor-containing film provided on the plurality of light-emitting elements directly or via a transparent adhesive layer;
    a transparent plate provided on the phosphor-containing film so as to directly contact the film;
    a white reflector to cover, of side surfaces of the plurality of light-emitting elements, a side surface not facing a gap therebetween and, of side surfaces of the phosphor-containing film, a side surface not located above the gap; and
    a transparent material provided in an entirety of the gap between the plurality of light-emitting elements and physically contacts an entire surface of each of the plurality of light-emitting elements surrounding the gap.

6. A method of manufacturing a light-emitting device, comprising:
    adhering a phosphor-containing film formed on a transparent plate to a plurality of light-emitting elements face-down mounted on a substrate such that the phosphor-containing film contacts the plurality of light-emitting elements directly or via a transparent adhesive layer; and
    covering with a white reflector a side surface of the plurality of light-emitting elements and, of side surfaces of the phosphor-containing film, at least a side surface not located above a gap between the plurality of light-emitting elements,
    wherein a region immediately above the gap is not covered with the phosphor-containing film, and
    wherein a part of the gap is filled with the white reflector and an empty space is formed on the part of the gap.

7. The method according to claim 6, wherein the phosphor-containing film comprises a plurality of phosphor-containing films that are each provided on each of the plurality of light-emitting elements.

8. The method according to claim 7, wherein the transparent plate comprises a single transparent plate with the plurality of phosphor-containing films formed on a surface thereof.

9. The method according to claim 7, wherein the transparent plate comprises a plurality of transparent plates each having each of the plurality of phosphor-containing films formed on a surface thereof.

10. A method of manufacturing a light-emitting device, comprising:

adhering a single phosphor-containing film formed on a single transparent plate to a plurality of light-emitting elements face-down mounted on a substrate such that the phosphor-containing film contacts the plurality of light-emitting elements directly or via a transparent adhesive layer;

filling an entirety of a gap between the plurality of light-emitting elements with a transparent material such that the transparent material physically contacts an entire surface of each of the plurality of light-emitting elements; and covering with a white reflector, of side surfaces of the plurality of light-emitting elements, a side surface not facing the gap therebetween and, of side surfaces of the phosphor-containing films, a side surface not located above the gap.

11. The light-emitting device according to claim 1, wherein the phosphor-containing film on a first light-emitting element of the plurality of light-emitting elements is separated from the phosphor-containing film on a second light-emitting element of the plurality of light-emitting elements.

12. The light-emitting device according to claim 1, wherein an edge of the phosphor-containing film and an edge of a light-emitting element of the plurality of light-emitting elements are co-linear nearest the gap.

13. The light-emitting device according to claim 1, wherein a top surface of the transparent plate protrudes above a highest point of a top surface of the white reflector.

14. The light-emitting device according to claim 1, wherein a top surface of the transparent plate and a top surface of the white reflector are substantially parallel.

15. The light-emitting device according to claim 1, wherein a width of the gap between adjacent light-emitting elements is equal to a width of the gap between the phosphor-containing film on adjacent light-emitting elements.

16. The light-emitting device according to claim 5, wherein the single phosphor-containing film provided on the plurality of light-emitting elements continuously extends over the gap between the plurality of light-emitting elements.

17. The light-emitting device according to claim 5, wherein the gap is formed by a top surface of the substrate, a first side surface of a first light-emitting element of the plurality of light-emitting elements, a second side surface of a second light-emitting element of the plurality of light-emitting elements facing the first side surface, and a bottom surface of the single phosphor-containing film.

18. The light-emitting device according to claim 5, wherein the transparent material contacts a top surface of the substrate, a first side surface of a first light-emitting element of the plurality of light-emitting elements, a second side surface of a second light-emitting element of the plurality of light-emitting elements facing the first side surface, and a bottom surface of the single phosphor-containing film.

19. The light-emitting device according to claim 5, wherein a height of the transparent material is less than a height of the light-emitting elements and the single phosphor-containing film.

20. The light-emitting device according to claim 5, wherein a height of the transparent material is substantially equal to a height of the light-emitting elements.

* * * * *